(12) United States Patent
Saito et al.

(10) Patent No.: US 6,444,940 B1  
(45) Date of Patent: Sep. 3, 2002

(54) HEAT TREATING DEVICE AND HEAT TREATING METHOD

(75) Inventors: Takanori Saito; Hisaei Osanai; Toshiyuki Makiya, all of Shiroyama-Machi (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 09/890,328
(22) PCT Filed: Nov. 29, 2000
(86) PCT No.: PCT/JP00/08401
§ 371 (c)(1), (2), (4) Date: Jul. 30, 2001
(87) PCT Pub. No.: WO01/41202
PCT Pub. Date: Nov. 29, 2000

(30) Foreign Application Priority Data

Nov. 30, 1999 (JP) .......................................... 11-339749

(51) Int. Cl.[7] .................................................. F27B 5/14
(52) U.S. Cl. .......................... 219/39; 219/411; 118/724; 118/725; 118/733
(58) Field of Search ................................. 219/390, 405, 219/411; 118/724, 725, 50.1, 733; 392/416, 418

(56) References Cited

U.S. PATENT DOCUMENTS

| | | | | |
|---|---|---|---|---|
| 5,048,800 A | * | 9/1991 | Miyazaki et al. | 266/256 |
| 5,329,095 A | * | 7/1994 | Okase | 219/390 |
| 5,540,782 A | | 7/1996 | Miyagi et al. | |

FOREIGN PATENT DOCUMENTS

| | | | |
|---|---|---|---|
| JP | 1-236615 | | 9/1989 |
| JP | 2-218117 | | 8/1990 |
| JP | 4-177837 | * | 6/1992 |
| JP | 4-121731 | | 10/1992 |
| JP | 5-136071 | * | 6/1993 |
| JP | 5291158 | | 11/1993 |
| JP | 6-208954 | | 7/1994 |
| JP | 8-17746 | | 1/1996 |
| JP | 8-017746 | * | 1/1996 |
| JP | 8-88192 | | 4/1996 |
| JP | 8-088192 | * | 4/1996 |
| JP | 2583503 | | 11/1996 |
| JP | 9-148315 | * | 6/1997 |
| JP | 9-148318 | | 6/1997 |
| JP | 11-102915 | | 4/1999 |

* cited by examiner

Primary Examiner—Teresa Walberg
Assistant Examiner—Shawntina Fuqua
(74) Attorney, Agent, or Firm—Smith, Gambrell & Russell, LLP

(57) ABSTRACT

The heat treatment apparatus has the reaction vessel and the holding tool contained in the reaction vessel for holding a plurality of objects to be processed. The lower end of the reaction vessel is closed by the cover and the insulating unit is installed between the cover and the holding tool. On the top of the insulating unit, the heating unit having a heating resistor composed of a carbon material of high-purity sealed in a quartz plate is installed. Heat insulators are installed under the heating unit. The insulating unit is fixed to the cover, and the revolving shaft for rotating the holding tool passes in the center of the insulating unit, and the electric feeding line member for feeding electric power to the heating unit is arranged outside of the insulating unit.

16 Claims, 12 Drawing Sheets

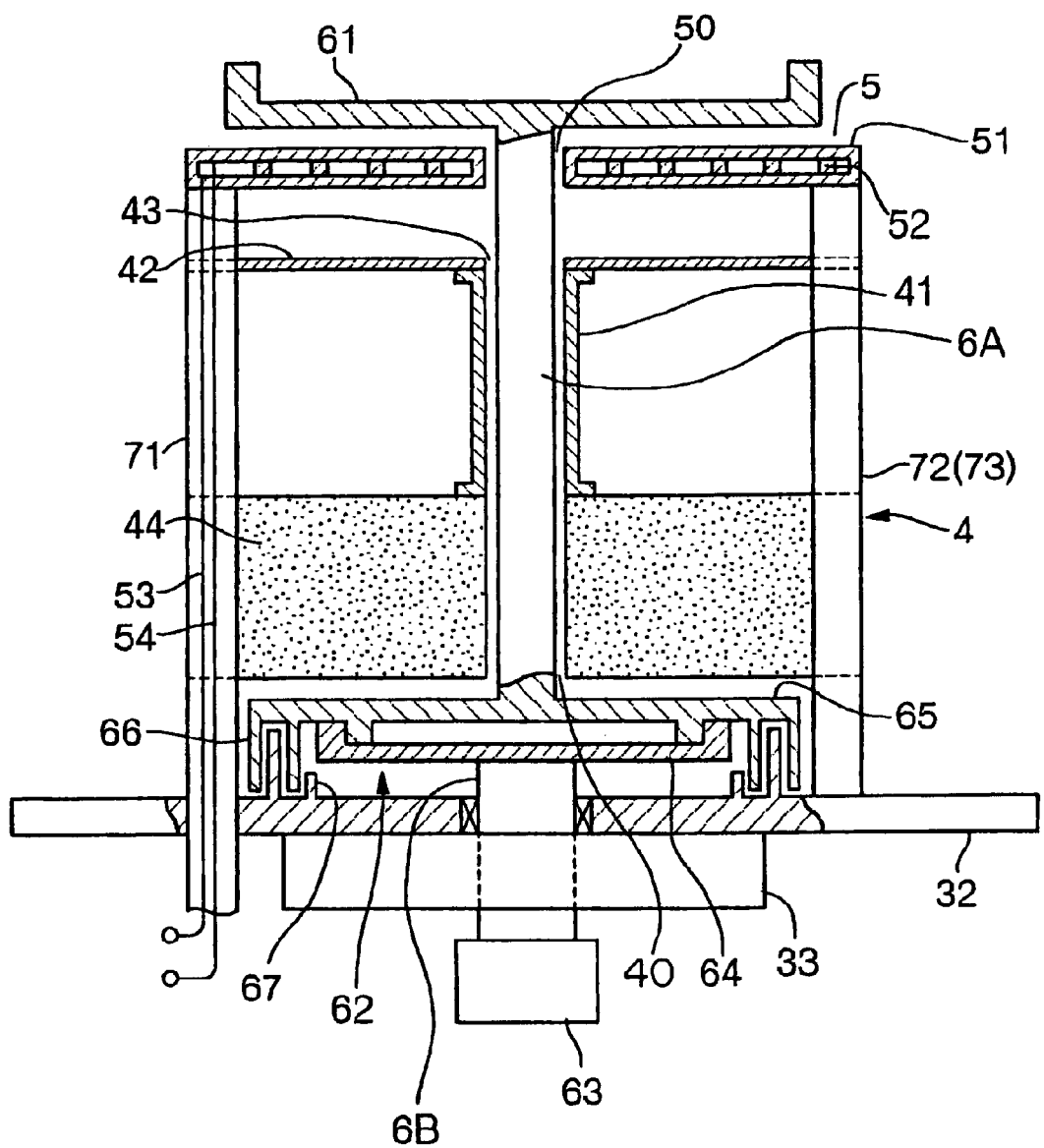
F I G. 3

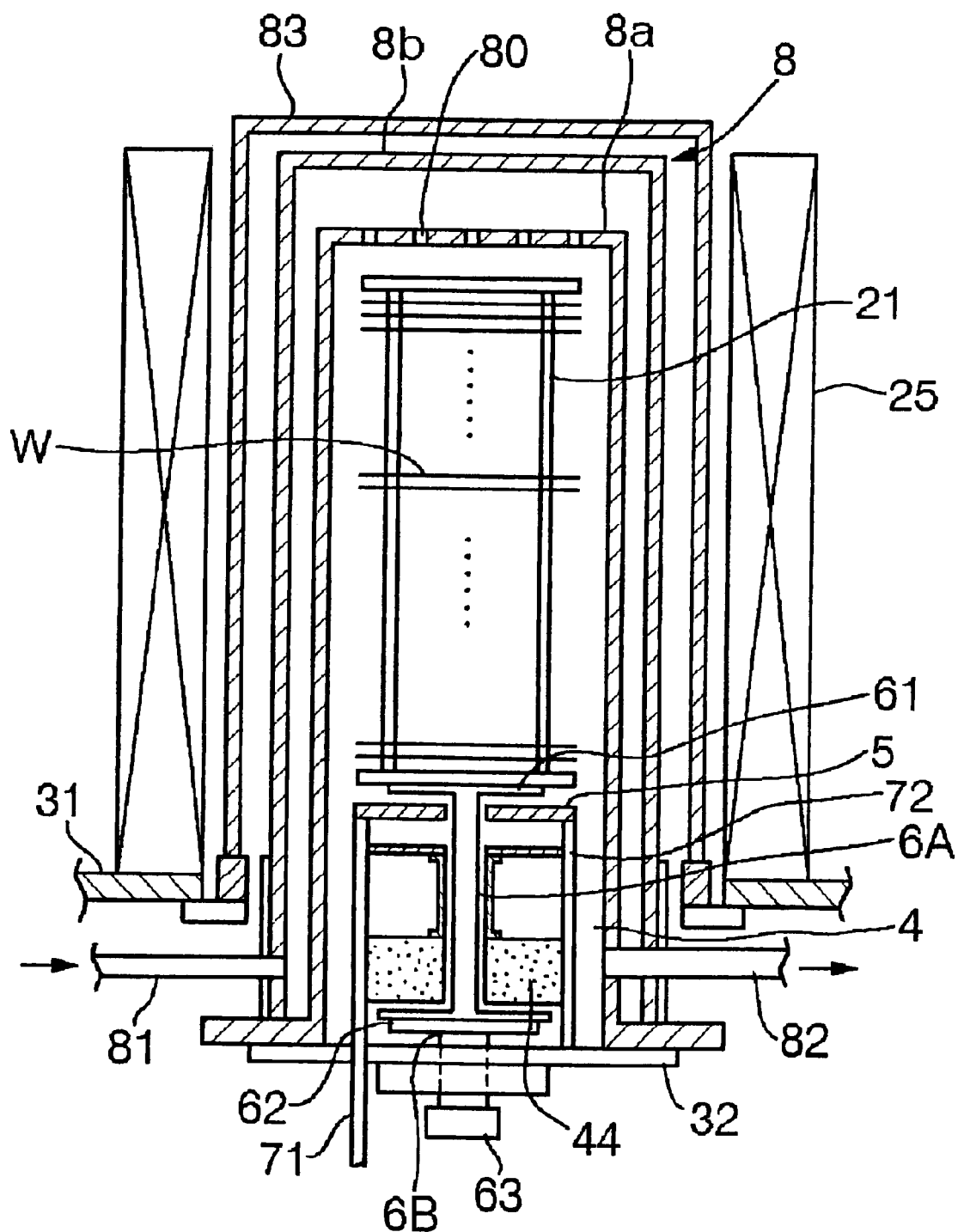
F I G. 6

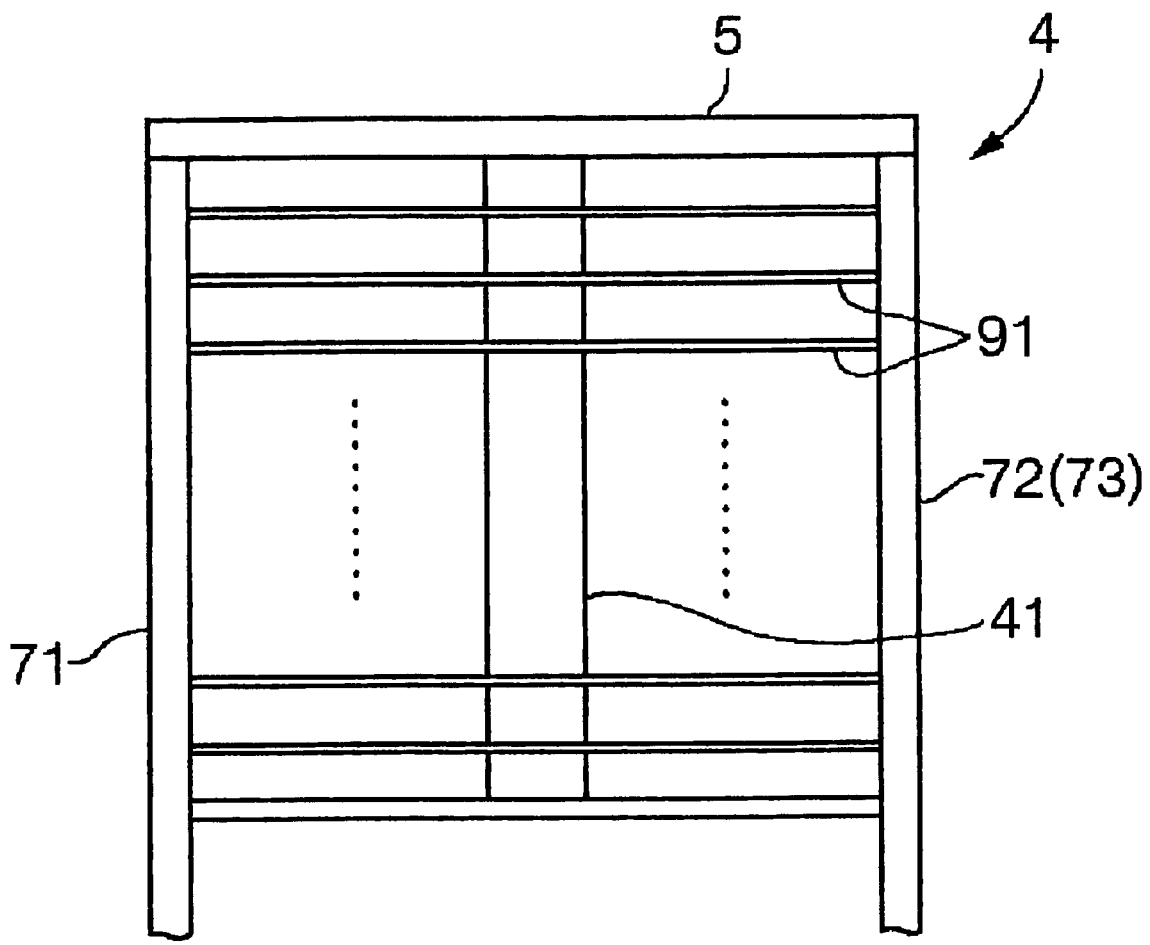
F I G. 7

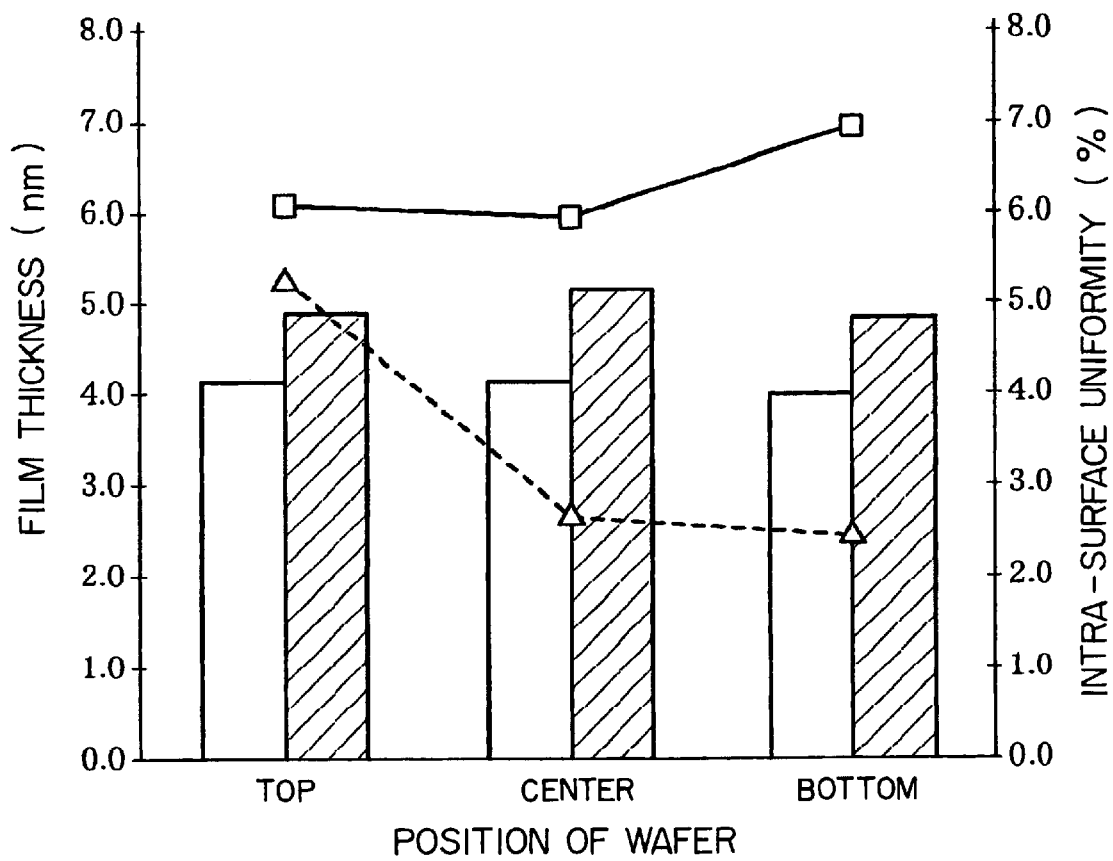
F I G. 9

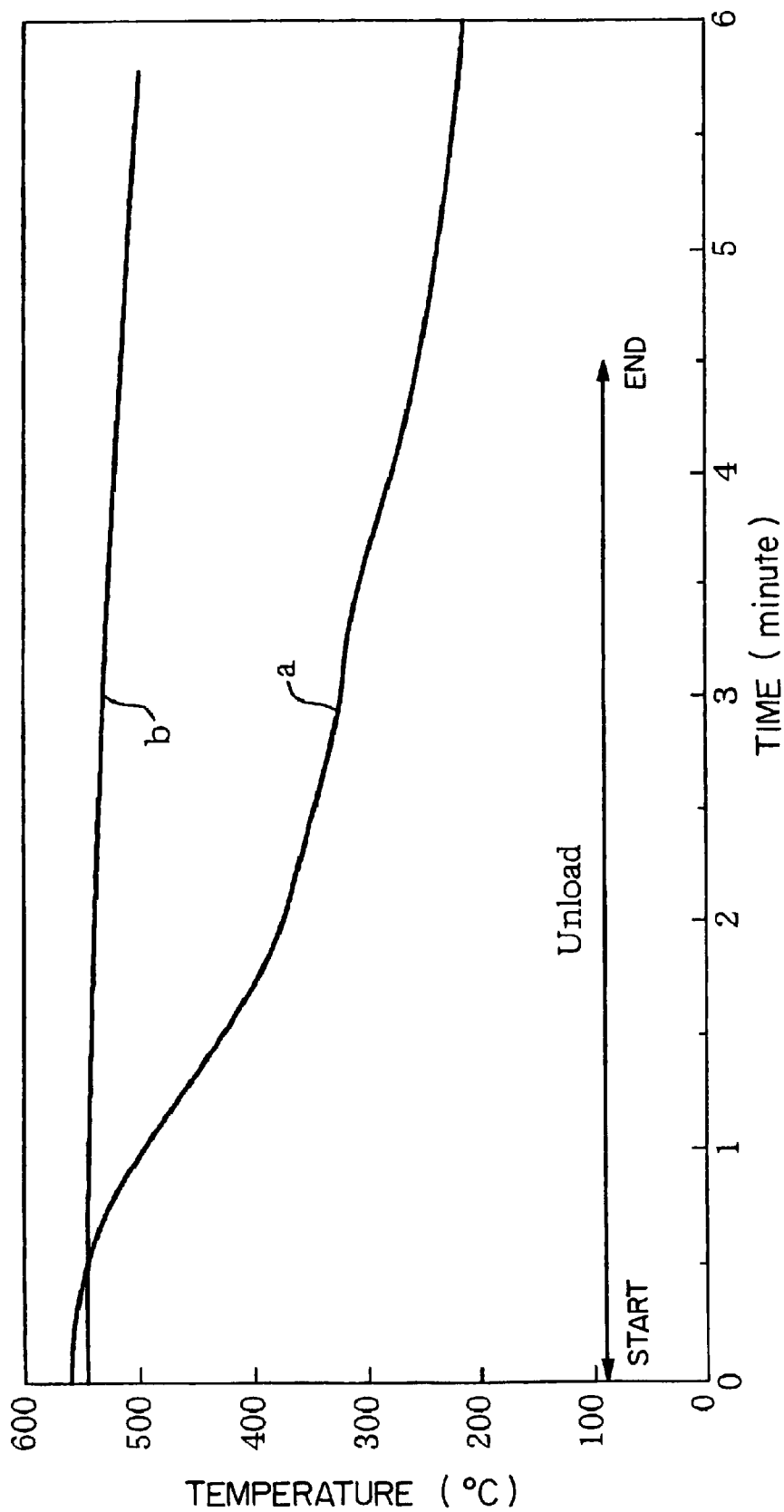
F I G. 11

HEAT TREATING DEVICE AND HEAT TREATING METHOD

BACKGROUND OF THE INVENTION

1. Field of the Invention

The present invention relates to a heat treatment apparatus and a heat treatment method.

2. Description of the Prior Art

A vertical heat treatment apparatus is known as one of semiconductor device manufacturing equipment. The heat treatment apparatus is of a batch type of heat-treating many wafers in a batch and a schematic view of a device for performing the vacuum CVD method is shown in FIG. 12. Numeral 1 indicates a wafer boat and the wafer boat 1 holds many wafers W in the terraced state and are transferred into a reaction vessel-composed of a double-structured reaction tube 11 and a cylindrical manifold 12 by an elevator not shown in the drawing. In this case, the reaction vessel is closed air-tightly by a cover 10. The reaction vessel is internally heated by a heater 13 surrounding the reaction tube 11 up to a predetermined temperature and decompressed down to predetermined pressure through an exhaust tube 14. Film forming gas is fed from the lower side of the reaction vessel via a gas feed tube 15, decomposed to thin film components, and deposited on the wafers W and the residual gas is lowered through the space between an inner tube 11a and an outer tube 11b from the ceiling section of the inner tube 11a and discharged through an exhaust tube 14.

Under the wafer boat 1, an insulating unit 16 composed of, for example, quartz fins is installed, and the atmosphere in which the wafers W are placed is insulated from the outside of the cover 10 and kept warm. On the lower side of the wafer boat 1, several dummy wafers W called a side wafer are placed instead of product wafers W.

Meanwhile, the following problems occur in the vertical heat treatment apparatus aforementioned.

(1) To prevent the heat of the atmosphere wherein the wafers W are placed from ejecting from the inside as far as possible, the heat capacity of the insulating unit 16 is set large. Therefore, when the temperature of the treating atmosphere is to be raised up to the target treating temperature and the temperature is to be stabilized, the temperature rise of the insulating unit 16 is delayed and heat is transferred from the treating atmosphere to the side of the insulating unit 16. As a result, the time period required to stabilize the temperature (recovery time) is prolonged, and it causes throughput reduction, and unless a sufficiently long recovery time is taken additionally, the reproducibility for each batch process gets worse.

(2) Since the surface area of the insulating unit 16 is large, the amount of water taken into the reaction vessel via the insulating unit 16 is increased and the water is ejected from the insulating unit 16 during heat treatment and taken into the thin films formed on the wafers W, causing a reduction in the film quality. Before starting the heat treatment, in order to remove impurities such as the water attached to the wafers W, the surface treatment may be performed by flowing, for example, hydrogen gas into the reaction vessel. However, water ejected from the insulating unit 16 is adsorbed to the wafers W, so that the effect of surface treatment is worse.

(3) Furthermore, the film forming gas introduced into the reaction vessel via the gas feed tube 15 passes and rises beside the insulating unit 16. Since the temperature of the insulating unit 16 is low, particularly when the gas flow rate is high, the amount of non-reacted gas reaching the treating atmosphere where the wafers W are placed is increased. As a result, the amount of gas to be decomposed in the treating atmosphere is increased and the generation amount of active species varies with the location, which affects the film thickness of the wafers W. Thus, both the uniformity of film thickness between wafers W and the uniformity of film thickness inside each wafer W are worse.

(4) Although the insulating unit 16 interrupts flowing of heat between the treating atmosphere and the outside of the reaction vessel, the heat dissipation amount on the lower side of the wafer loading area of the wafer boat 1 is large. Thus, side wafers (dummy wafers) have to be placed on several stages of the wafer boat 1 from the lowest stage, thereby the loading area of product wafers W is inevitably narrowed. Therefore, even if the number of wafers to be contained is increased in the wafer boat 1, the number of product wafers W to be processed per a batch process is reduced, and as a result, the improvement of throughput is disturbed.

SUMMARY OF THE INVENTION

The present invention was developed with the foregoing in view and is intended to provide a vertical heat treatment apparatus for improving the throughput.

The present invention is a heat treatment apparatus having a reaction vessel with the lower open end, a holding tool contained in the reaction vessel for holding a plurality of objects to be processed, and a cover for blocking the opening at the lower end of the reaction vessel, wherein an insulating unit is provided between the cover and the holding tool, and the insulating unit has a heating unit, and the heating unit comprises ceramics and a heating resistor in the ceramics including few metallic impurities.

The present invention is a heat treatment apparatus that the heating unit is arranged at least either one of the top and side of the insulating unit.

The present invention is a heat treatment apparatus that the insulating unit comprises insulating fins positioned on a side of the heating unit side and heat insulators positioned under the insulating fins.

The present invention is a heat treatment apparatus that the insulating unit comprises a plurality of insulating fins arranged in the horizontal direction.

The present invention is a heat treatment apparatus that the insulating unit is fixed to the cover and the revolving shaft is connected to the holding tool, passes through the through hole of the insulating unit, and is connected to the drive unit.

The present invention is a heat treatment apparatus that the revolving shaft comprises a first revolving shaft passing through the through hole of the insulating unit and a second revolving shaft which is connected to the first revolving shaft through a transmission unit and reaches the drive unit.

The present invention is a heat treatment apparatus that the second revolving shaft passes through the cover and the periphery of the second revolving shaft in the insulating unit passing through the cover is enclosed by a labyrinth having a cover projection extending from the cover and a transmission projection extending from the transmission unit.

The present invention is a heat treatment apparatus that a plurality of supports are arranged on the outer periphery of the insulating unit, at least one support is a tubular one passing through the cover, and an electric feeding line for the heating unit is arranged in the tubular support.

The present invention is a heat treatment apparatus that the heating resistor is made of a carbon material of high purity.

The present invention is a heat treatment apparatus that ceramics are quartz.

According to the present invention, the heat dissipation amount ejected from the treating atmosphere in the reaction vessel to the outside via the insulating unit is reduced, so that the treating atmosphere can be immediately stabilized at the target temperature and the treating area where the temperature is stabilized can be ensured wide. When the insulating unit is structured so as to be fixed to the cover, the electric feed line member can be easily pulled out.

The present invention is a heat treatment method having the steps of holding objects to be processed in a multistage manner by a holding tool, transferring the holding tool holding the objects to be processed into a reaction vessel having a lower open end from underneath, heating the inside of the reaction vessel by a heater installed outside the reaction vessel, feeding film forming gas to said reaction vessel to perform a film forming process to objects to be processed, wherein at the step of feeding film forming gas, a temperature on un under side of the holding tool is higher than that in the atmosphere where the objects to be processed are placed.

The present invention is a heat treatment method that at the step of feeding film forming gas, film forming gas is fed from an under side of the holding tool to the above side of the holding tool and the temperature in the passing area of film forming gas on the under side of the holding tool is higher than that in the atmosphere where the objects to be processed are placed.

The present invention is a heat treatment method that at the step of feeding film forming gas, film forming gas is fed from the above side of the holding tool to the under side of the holding tool.

The present invention is a heat treatment method that the under side of the holding tool is heated by the insulating unit having the heating unit installed under the holding tool and a temperature on the under side of the holding tool is higher than that in the atmosphere where the objects to be processed are placed.

According to the present invention, the decomposition of film forming gas is promoted, so that a process of high uniformity can be performed.

BRIEF DESCRIPTION OF THE DRAWINGS

FIG. 3 is a cross sectional view showing an insulating unit used in the embodiment according to the present invention.

FIG. 6 is a longitudinal side view showing the whole constitution of another embodiment according to the present invention.

FIG. 7 is a side view showing another example of an insulating unit used in the present invention.

FIG. 9 is an illustration showing the uniformity of film thickness when the device of the present invention and a conventional device are used.

FIG. 11 is a characteristic diagram showing results of the temperature lowering speed measured for an insulating unit used in the present invention and a conventional insulating unit.

DESCRIPTION OF THE PREFERRED EMBODIMENTS

Figure 1:
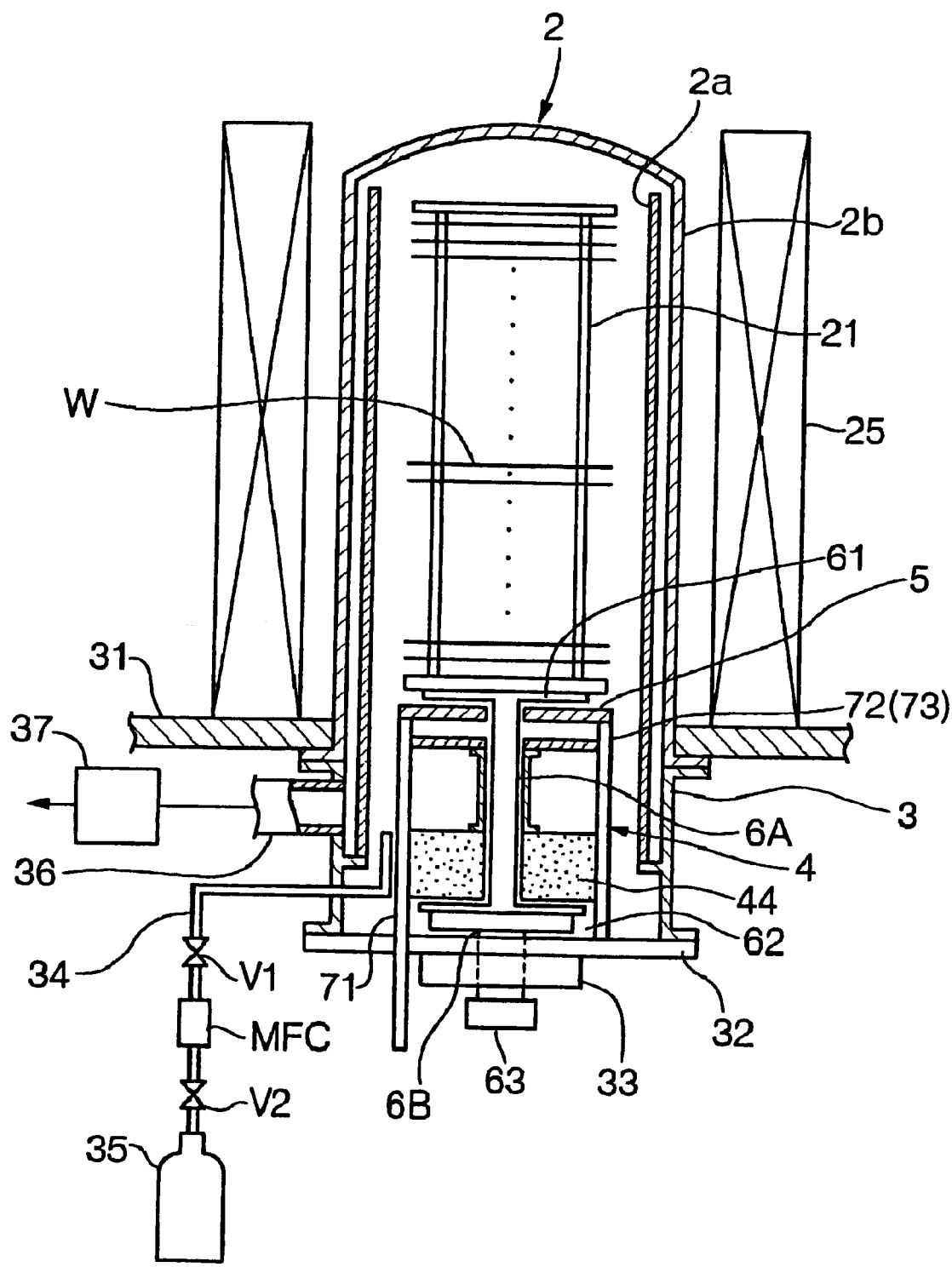
FIG. 1 is a longitudinal side view showing the whole constitution of an embodiment according to the present invention.
Figure 2:
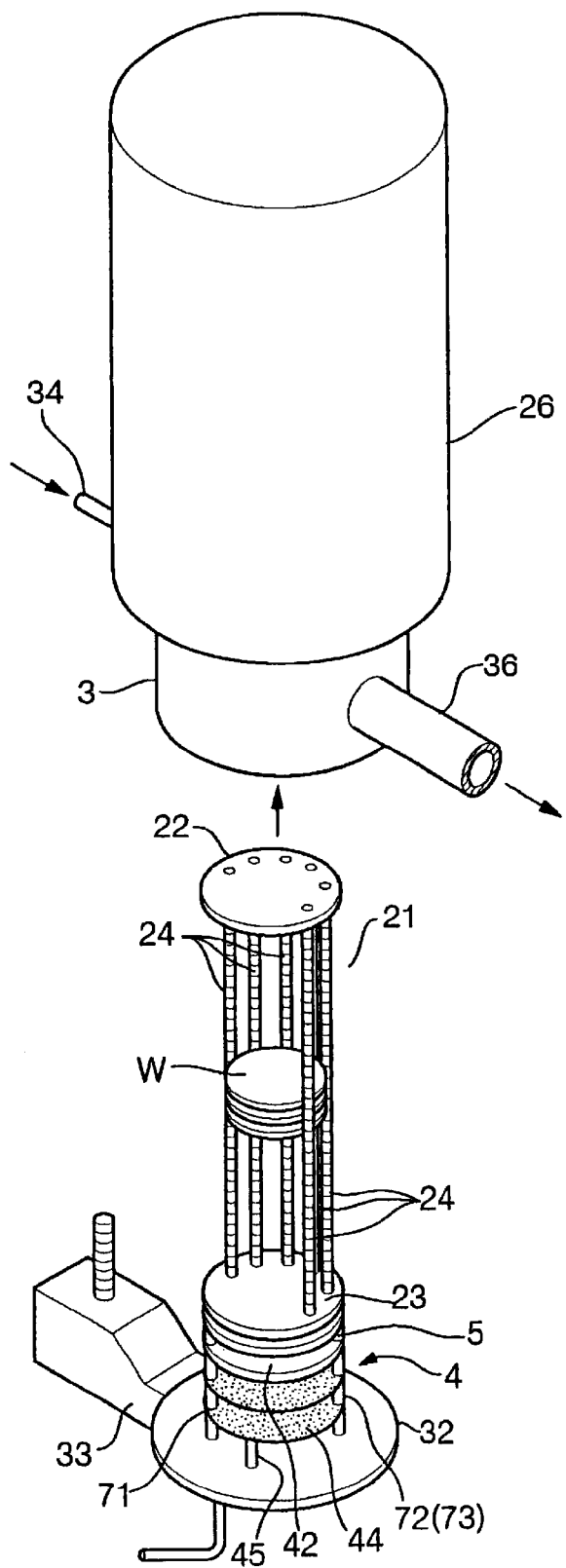
FIG. 2 is a perspective view showing the appearance of the embodiment according to the present invention.

FIG. 1 is a whole schematic view showing an embodiment according to the present invention, which is applied to a vertical heat treatment apparatus and FIG. 2 is a prospective view of the vertical heat treatment apparatus. In FIG. 1, numeral 2 indicates a double-tube structured reaction tube having an inner tube 2a and an outer tube 2b which are made of, for example, quartz and a metallic cylindrical manifold 3 is installed on the lower side of the reaction tube 2. A reaction vessel is composed of the reaction tube 2 and the manifold 3.

The inner tube 2a has an open upper end and is supported by an inside portion of the manifold 3. The outer tube 2b has a closed upper end and its lower end is connected to the upper end of the manifold 3 air-tightly. In this example, the reaction vessel is composed of the inner tube 2a, the outer tube 2b, and the manifold 3. Numeral 31 indicates a base plate.

Inside the reaction tube 2, a large number of, for example, 126 wafers W, which are objects to be processed, are loaded horizontally in the terraced state in a wafer board 21 (holding tool) at vertical intervals. The wafer boat 21, as shown in FIG. 2, is structured so that a plurality of supports 24 are installed between a top plate 22 and a bottom plate 23 and slits for holding the peripheries of the wafers W are formed in the supports 24. The wafer boat 21 is held on a cover 32 via an installation area of an insulating unit 4. The insulating unit 4 will be described later in detail. The cover 32 is mounted on a boat elevator 33 for transferring the wafer boat 21 in or out of the reaction tube 2 and when the elevator 33 is at the upper limit position, the cover 32 has a role to close the lower opening of the manifold 3, that is, the lower opening of the reaction vessel composed of the reaction tube 2 and the manifold 3.

Around the reaction tube 2, a heater 25 composed of, for example, a heating resistor is installed so as to surround the reaction tube 2. Although not shown in FIG. 1, an insulating layer is installed around the heater 25, and a housing is additionally installed outside it. A heating oven 26 (FIG. 2) is composed of the heater 25, the insulating layer and the housing. Further, for example, to control the heat dissipation amount from the heating oven 26 or another heating part into the clean room, a cooling water system for circulating cooling water around the heating oven 26 or another heating part is generally installed and a flow rate meter and an on-off valve are installed for each system line. In this case, when the supply of water is stopped due to a power failure or others, the flow of cooling water is stopped, and the temperature of cooling water suddenly rises, and the pressure is also increased suddenly. As a result, it might happen that cooling water flows backward toward the upstream side, and the flow rate meter is damaged. Therefore, to prevent them, a flow rate adjustable check valve (relief valve) may be installed in each circulation system.

In FIG. 1 again, a plurality of gas feed tubes are installed around the manifold 3 so as to feed a plurality of processing gases (film forming gases) into the inner tube 2a. In FIG. 1, only one gas feed tube 34 is shown and the gas feed tube 34 is connected to a gas feed source 35 via a valve V1, a flow rate meter MFC, and a valve V2. An exhaust tube 36 is connected to the manifold 3 so as to exhaust gas from the space between the inner tube 2a and the outer tube 2b and the inside of the reaction tube 2 can be kept in a predetermined vacuum atmosphere by a vacuum pump 37.

In FIG. 1, processing gas is fed into the inner tube 2a by the gas feed tube 34 from the under side of the wafer boat 2 to the above side thereof. However, it is possible to arrange the gas feed tube 34 above the inner tube 2a and feed processing gas from the above side of the wafer boat 21 to the under side thereof.

Next, the insulating unit 4 and the part relating to it will be explained by referring to FIG. 3. The insulating unit 4 has a planar and circular heating unit 5 and a hole 50 is formed at the center of the heating unit 5. Below the heating unit 5, a shaft tube 41, for example, made of quartz is installed perpendicularly so that the inner space thereof can be aligned with the hole 50. On the upper end of the shaft tube 41, a circular fin 42 which is an insulating member is installed almost horizontally via the space between the shaft tube 41 and the heating unit 5 and at the center of the fin 42, a hole 43 is formed so as to communicate with the inner space of the shaft tube 41. The fin 42 plays an insulating role of controlling heat dissipation from the wafer processing area to the outside and a role of reflecting radiant heat from the heating unit 5 and it is composed of, for example, opaque quartz or silicon carbide (SiC). Under the shaft tube 41, a circular insulating member (insulator) 44 having a hole 40 formed at its center so as to interconnect with the inner space of the shaft tube 41 is installed so as to be supported and fixed onto the cover 32 via support members 45 (shown in FIG. 2). The support members 45 are positioned at intervals formed by dividing the periphery of the unit 4 into three. The insulating member 44 plays a roll of suppressing dissipation of heat from the above side of the insulating member 44 toward the cover 32 and the insulating member 44 may be made of, for example, a quartz block or stepwise stacked fins.

The hole 50 of the heating unit 5, the hole 43 of the fin 42, the inner space of the shaft tube 41, and the hole 40 of the insulating member 44 form a through hole which a first revolving shaft 6A for rotating the wafer boat 21 around the perpendicular shaft passes through. The first revolving shaft 6A has a table 61 provided on its top and the wafer boat 21 is loaded on the table 61. The lower part of the first revolving shaft 6A is connected to a second revolving shaft 6B via a transmission unit 62 and the second revolving shaft 6B passes through the cover 32 air-tightly and is connected to a drive unit 63 installed to the boat elevator 33. The drive unit 63 is composed of, for example, a pulley connected to the revolving shaft 6B and a motor for driving the pulley via a belt.

The transmission unit 62 has a table 64 formed at the upper end of the second revolving shaft 6B and a circular receiver 65 formed at the lower end of the first revolving shaft 6A, and a circular receiver 65 is mounted on the table 64. The rotation of the second revolving shaft 6B is transferred to the first rotation shaft 6A through the transmission unit 62. Further, for example, on the bottom of the periphery of the receiver 65, a plurality of projections (transmission projections) 66 having a comb-teeth-shaped section which are projected downward are formed and on the top of the cover 32, a plurality of projections (cover projections) 67 having a comb-teeth-shaped section which are projected upward are formed. These projections 66 and 67 are overlaid alternately, thereby a labyrinth is formed. The periphery of the second revolving shaft 6B is surrounded by the labyrinth with a space between the second revolving shaft 6B and the labyrinth, and therefore gas in the reaction tube 2 does not enter the space between the second revolving shaft 6B and the labyrinth so that a side of the bearing of the second revolving shaft 61 is not exposed to the gas.

Figure 4:
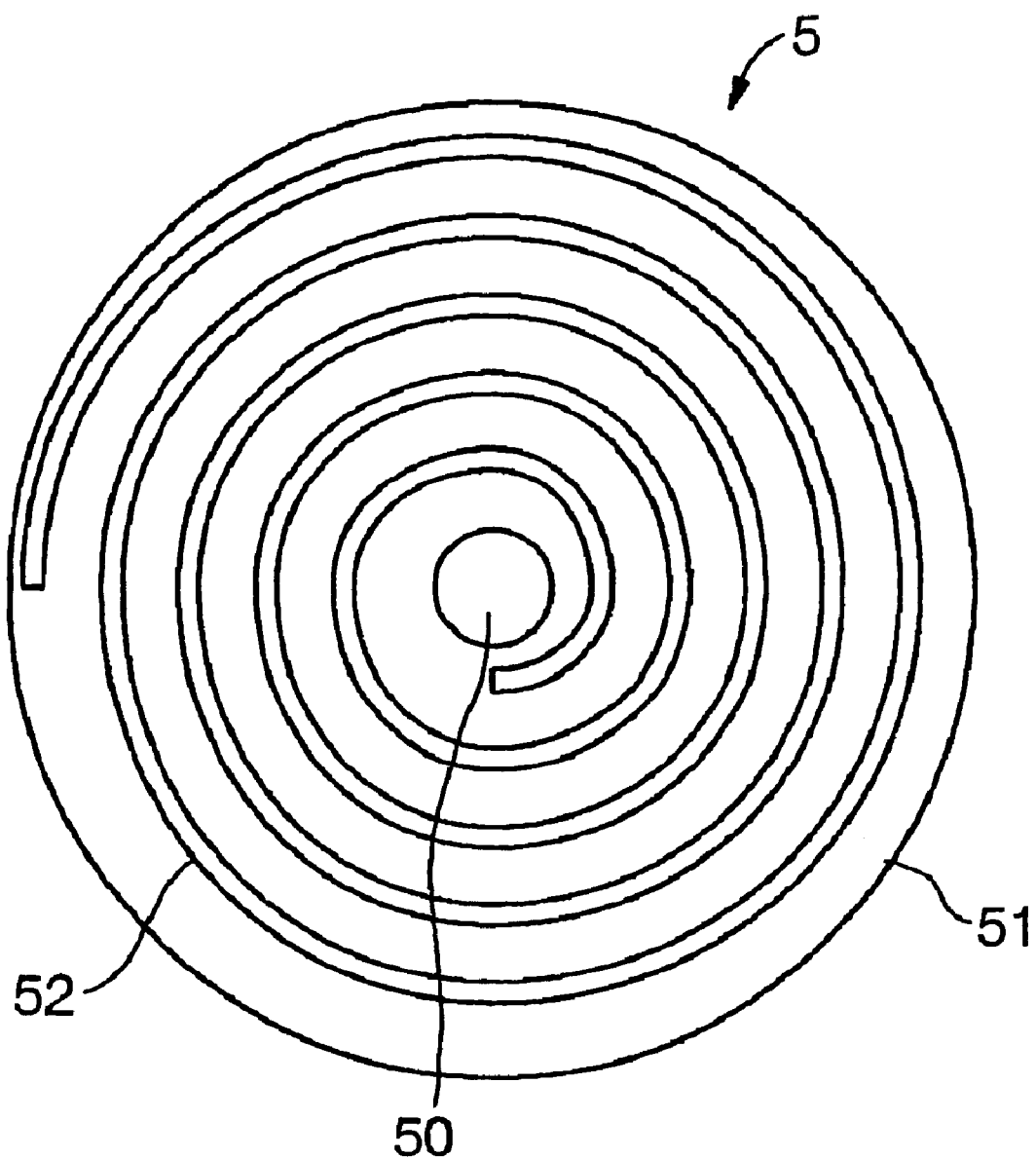
FIG. 4 is a plan view showing a heating unit incorporated in an insulating unit used in the embodiment according to the present invention.

The heating unit 5 has ceramics for example, quartz, and a heating resistor including few metallic impurities sealed in the ceramics. As shown in FIGS. 3 and 4, heater lines 52 made of a carbon material of high purity are arranged spirally, for example, in a circular plate of quartz (quartz plate) 51 having a thickness of about 8 mm. Quartz may be lay between the heater lines 52 neighboring each other and in this case, the heater lines 52 are laid between spiral quartz division walls. To increase an insulation effect, it is preferable to make the heating unit 5 which is equal to the wafers W in size or larger. Further, on the bottom side of the periphery of the heating unit 5, for example, quartz supports 71, 72, 73 (only two supports can be seen in the drawing) are installed in the periphery at three points equally divided and the supports 71 to 73 are fixed to the cover 32.

The support 71 among the three supports 71 to 73 is composed of a tubular support and both ends of the heater line 52 are gathered, for example, at one location of the periphery of the heating unit 5. A pair of feeding line members connected to the heater line 52, for example, a feeding line of the same material as that of the heater line 52 passes through a thin quartz tube, and further the quartz tube passes through the tubular support (support 71), and feeding lines 53 and 54 extend outside the cover 32. Therefore, when an external power unit is connected to the feeding lines 53 and 54, the heater line 52 can generate heat. The two residual supports 72 and 73 may be tubular or cylindrical and are supported on the top of the cover 32.

Next, the operation of the embodiment aforementioned will be explained. Here, as an example of a concrete process, in which an oxide film called an HTO (high temperature oxide) is formed on each wafer W by the CVD process, will be described. Firstly, a predetermined number of wafers W, which are objects to be processed, are held in the wafer boat 21 in the terraced state, and the boat elevator 33 is moved up, and the wafers W are transferred in the reaction vessel. At the time of transfer of the wafer boat 21, the treating atmosphere of the reaction vessel is kept, for example, at about 600° C. After the wafer boat 21 is transferred and the lower end opening of the reaction vessel (more in detail, the lower end opening of the manifold 3) is closed by the cover 32, the treating atmosphere is increased to, for example, before or after 800° C. by the heater 25, and the reaction vessel is decompressed down to a predetermined degree of vacuum by a vacuum pump 37 via the exhaust tube 36.

Figure 5:
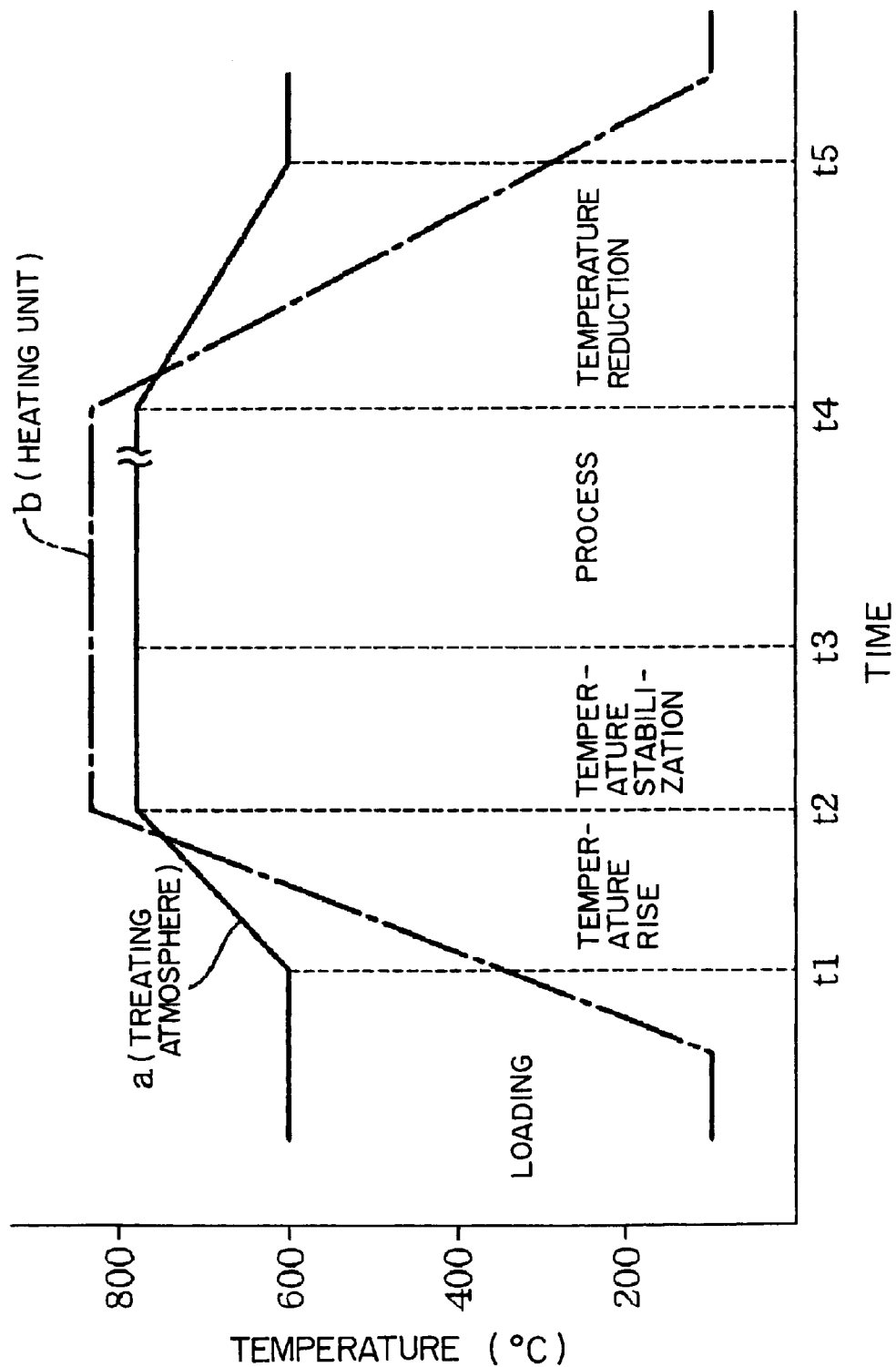
FIG. 5 is a characteristic diagram showing temperature changes in a treating atmosphere and a heating unit.

On the other hand, the heating unit 5 of the insulating unit 4 also starts temperature rise, for example, halfway through transfer of the wafer boat 21 and raises the temperature, for example, close to 840° C. which is higher than the temperature in the treating atmosphere at the time of film forming. Here, the situation of each change with time of the temperature in the treating atmosphere (the temperature in the atmosphere where the wafers W are placed, which is, for example, the temperature at the height and location of the center in the arrangement area of the wafers W) and the temperature of the heating unit 5 is schematically indicated in FIG. 5 respectively by a solid line "a" and a dashed line "b". In FIG. 5, the time t1 indicates the end time of transfer (loading) of the wafer boat 21 and the time t2 indicates the point of time when the treating atmosphere reaches the target temperature. The heating unit 5 stands by, for example, in the neighborhood of 100° C. and rises, for example, close to the target temperature 840° C. from here. The points of time when the heating unit 5 and the treating atmosphere reach the respective target temperatures are almost at the same timing. The temperature of the heating unit 5 mentioned above is the temperature measured by a temperature sensor installed in a location at a distance of several mm from the surface of the heating unit 5.

Thereafter, the reaction vessel stand by until the time t3 as a time (recovery time) for temperature stabilization without performing the process. After the time t3 elapses, the reaction vessel, keeping pressure in the reaction vessel, for example, at a predetermined degree of vacuum, starts performing the process by feeding processing gas (film forming gas) composed of dichlorosilane ($SiH_2Cl_2$) gas and nitrogen monoxide ($N_2O$) gas into the reaction vessel (the reaction tube 2 and the manifold 3). In this case, the revolving shafts 6A and 6B are rotated and the wafer boat 21 is rotated.

In this case, the temperature in the neighborhood of the surface of the heating unit 5 is about 840° C., so that the periphery of the heating unit 5 and the part slightly under the heating unit 5 are higher than the temperature 800° C. or so of nitrogen monoxide gas fed to the lower side of the reaction tube 2 are decomposed remarkably when they pass beside the insulating unit 4 and diffused inward the treating atmosphere in a decomposition-promoted state, and active species are deposited on the wafers W, and a silicon oxide film is formed. The power for the heater 25 is controlled starting from the time t4 so as to lower the temperature in the reaction vessel, and also the supply power to the heating unit 5 is reduced to 0 so as to lower the temperature of the heating unit 5, and for example, at the point of time (time t5) when the temperature in the treating atmosphere is reduced to 600° C., the wafer boat 21 is lowered.

According to the embodiment aforementioned, the following effects can be produced.

(1) The insulating unit 4 has the heating unit 5 on the top thereof and allows the heating unit 5 to generate heat at the step of raising the temperature in the treating atmosphere in the reaction vessel and the step of stabilizing it at the target temperature, so that the quantity of heat dissipated from the treating atmosphere to the outside via the insulating unit 4 is reduced. The insulating unit 4 has a good heat retaining property because it has the heating unit 5, thus the heat capacity can be made smaller, so that the warming speed of the whole insulating unit 4 is fast. As a result, the time required to allow the temperature in the treating atmosphere to reach the target temperature and then stabilize it at the target temperature, that is, the temperature stabilization time (recovery time) may be short and the throughput can be improved. Further, variations in the recovery time for each batch process are reduced, so that the reproducibility of the process is improved.

(2) Since the insulating effect of the insulating unit 4 is high as mentioned above, the area of high temperature uniformity is spread downward. Thus, in the lower part of the wafer boat 21 where side wafers must be loaded due to a low temperature until now, product wafers W can be loaded, and therefore the number of wafers to be processed per batch is increased, so that the throughput is improved also from this viewpoint.

(3) Film forming gas fed into the reaction vessel via the gas feed tube 34 is heated by the heating unit 5 and decomposed to a certain extent before it reaches the treating atmosphere, so that the amount of non-reacted gas in the treating atmosphere is reduced. As a result, between the respective wafers W arranged in the wafer boat 21 and in the surface of each wafer W, the uniformity of density of active species is increased and the uniformity of film thickness between the wafers W and in each wafer surface is increased.

(4) Since the heat capacity of the insulating unit 4 may be small, the temperature lowering speed of the insulating unit 4 at the time of transferring (unloading) the wafer boat from the reaction vessel to the outside is fast, thus the thermal damage to the robot and sensor installed in the loading area under the reaction vessel by the insulating unit 4 can be reduced.

(5) The insulating unit 4 is fixed to the cover 32 and the revolving shafts (the revolving shafts 6A and 6B) for rotating the wafer boat 21 passes through the insulating unit 4, so that the feeding lines 53 and 54 of the heater lines 52 of the heating unit 5 can be easily pulled out externally. Although the present invention is not limited to the insulating unit 4 being fixed to the cover 32, when the insulating unit 4 is made rotate as conventionally, a slip ring must be used in order to pull out the feeding lines 53 and 54 externally, so that the structure of the embodiment aforementioned would be wiser.

Next, another embodiment of the present invention will be described. The embodiment aforementioned is a device for performing the film forming process by the vacuum CVD method, but the present invention can be applied also to an oxidation-diffusion oven. FIG. 6 shows a vertical heat treatment apparatus for oxidizing the silicone film on each wafer W by oxidation gas. In FIG. 6, the same numeral is assigned to each of the corresponding parts to those shown in FIG. 1 so as to avoid complication of numerals. The differences of the vertical heat treatment apparatus from the device shown in FIG. 1 are a first point that the reaction vessel is composed of a double-tube structured reaction tube 8 composed of an inner tube 8a and an outer tube 8b without using the manifold 3, a second point that oxidation gas, for example, oxygen gas is fed into the gap between the inner tube 8a and the outer tube 8b via a gas feed tube 81, passes through a hole 80 in the top of the inner tube 8a, and is ejected from the lower side of the inner tube 8a via an exhaust tube 82, a third point that the treating pressure is almost the normal pressure, and the temperature in the treating atmosphere is generally higher than that when the vacuum CVD method is used. Numeral 83 shown in FIG. 6 indicates a uniform heat tube.

Further, depending on the kind of heat treatment, for example, when an epitaxial growth film is to be formed, the film quality is controlled by the moisture amount adhered to each wafer W. According to the present invention, as mentioned above, the heat capacity of the insulating unit 4 may be small, so that the surface area of the component of the insulating unit 4 may be small and the amount of moisture to be brought into the reaction vessel from the outside via the insulating unit 4 is reduced. Therefore, the film quality is improved. As already mentioned, the wafers W may be subjected to the surface treatment before or during temperature rise. In this case, the amount of moisture to be brought in is little, so that the improvement of effect of the surface treatment of the wafers W can be expected.

Figure 8:
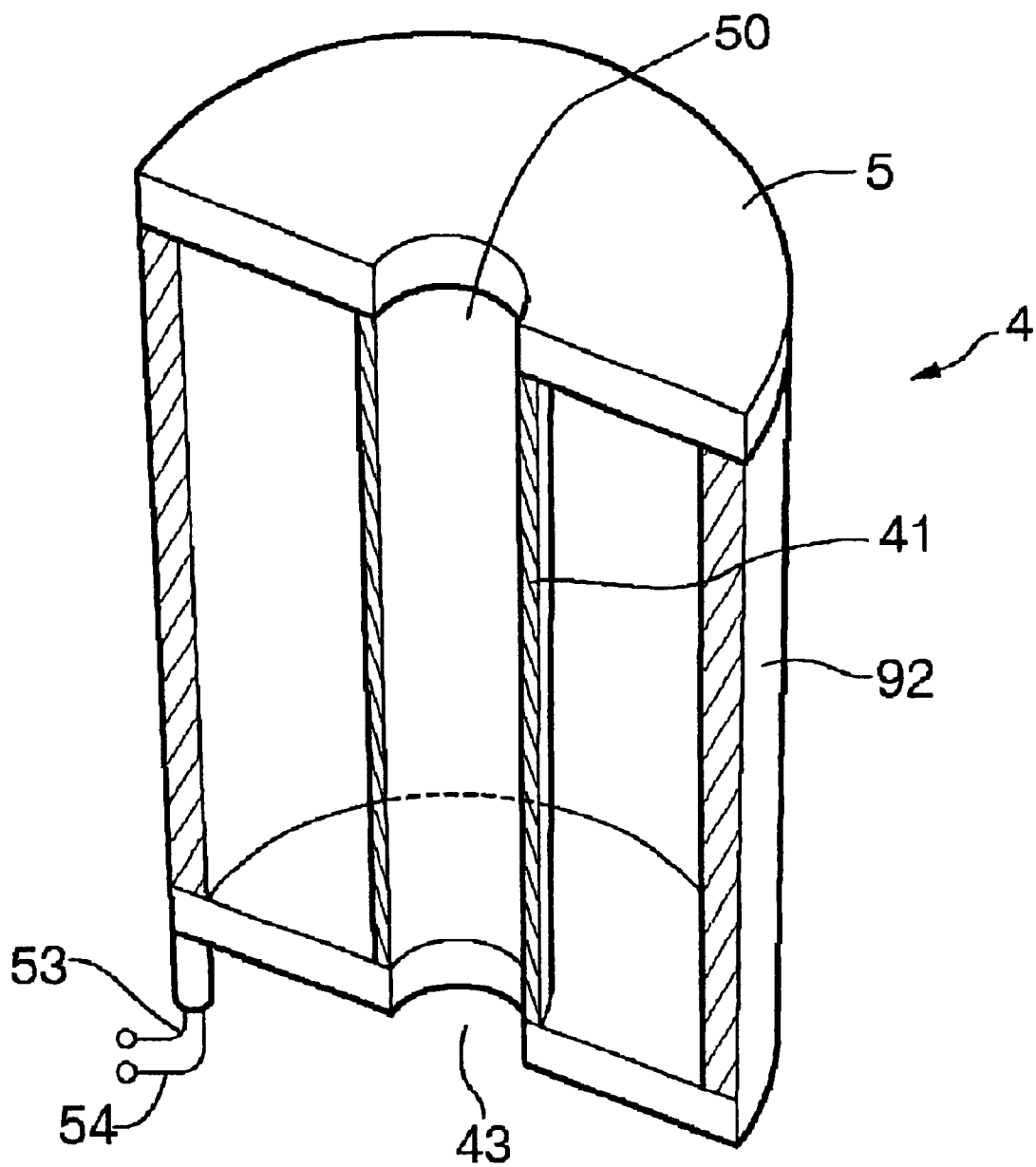
FIG. 8 is a perspective view showing still another example of an insulating unit used in the present invention.

Other examples of the insulating unit 4 are shown in FIGS. 7 and 8. The insulating unit 4 shown in FIG. 7 is the insulating unit 4 already mentioned that for example, fins 91 made of quartz which are an insulating member are laminated in stages under the heating unit 5.

The insulating unit 4 shown in FIG. 8 is that not only the top but also the side are composed of a cylindrical heating unit 92. The cylindrical heating unit 92 can be prepared by locating, for example, the heating resistor aforementioned between the double-structure quartz tubes and sealing the upper and lower edges. In this case, in the area enclosed by the cylindrical heating unit 92, for example, quartz blocks or quartz fins may be arranged. Further, the insulating unit 4 may be structured so as to install the heating unit 92 only on the side instead of installing the heating unit 5 on the top, or install the heating unit 5 only on the bottom, or arrange the fins as mentioned already on the top and arrange the heating unit 5 on the under side. Further, on the surface of the heating unit 5, a protective film may be formed, for example, by CVD or the surface may be covered with a thin protective plate. The material of the insulating unit 4 is not limited to quartz and it may be ceramics such as silicon carbide (SiC). Further, the present invention may be applied to a device that the wafer boat 21 is not rotated.

EMBODIMENT

Embodiment 1

A silicon oxide film was formed on a 200-mm wafer (8 inch wafer) using the vertical heat treatment apparatus shown in FIG. 1. A wafer boat capable of containing 126 wafers was used, and the temperature in the treating atmosphere at the time of loading the wafer boat was set to 600° C., and the temperature was increased close to 800° C., and the wafers were treated for 80 minutes aiming at a film thickness of 5.5 nm. As film forming gas, dichlorosilane gas and nitrogen monoxide gas were fed at flow rates of 200 sccm and 400 sccm respectively and the pressure in the reaction vessel was kept at a predetermined degree of vacuum. The temperature in the neighborhood of the surface of the heating unit 5 of the insulating unit 4 was raised close to 840° C. as explained in the embodiment aforementioned.

Regarding the silicon oxide films obtained in this way, each film thickness (average film thickness) of the wafers w positioned on the top, at the center, and on the bottom was checked, and the bar graphs (white blank) shown in FIG. 9 were obtained, and the intra-surface uniformity of the film thickness of the wafer W at each position was checked, and the marks Δ were obtained. The top position, center position, and bottom position mean the 6th stage, 58th stage, and 110th stage respectively counted from the uppermost stage of the wafer boat.

Figure 12:
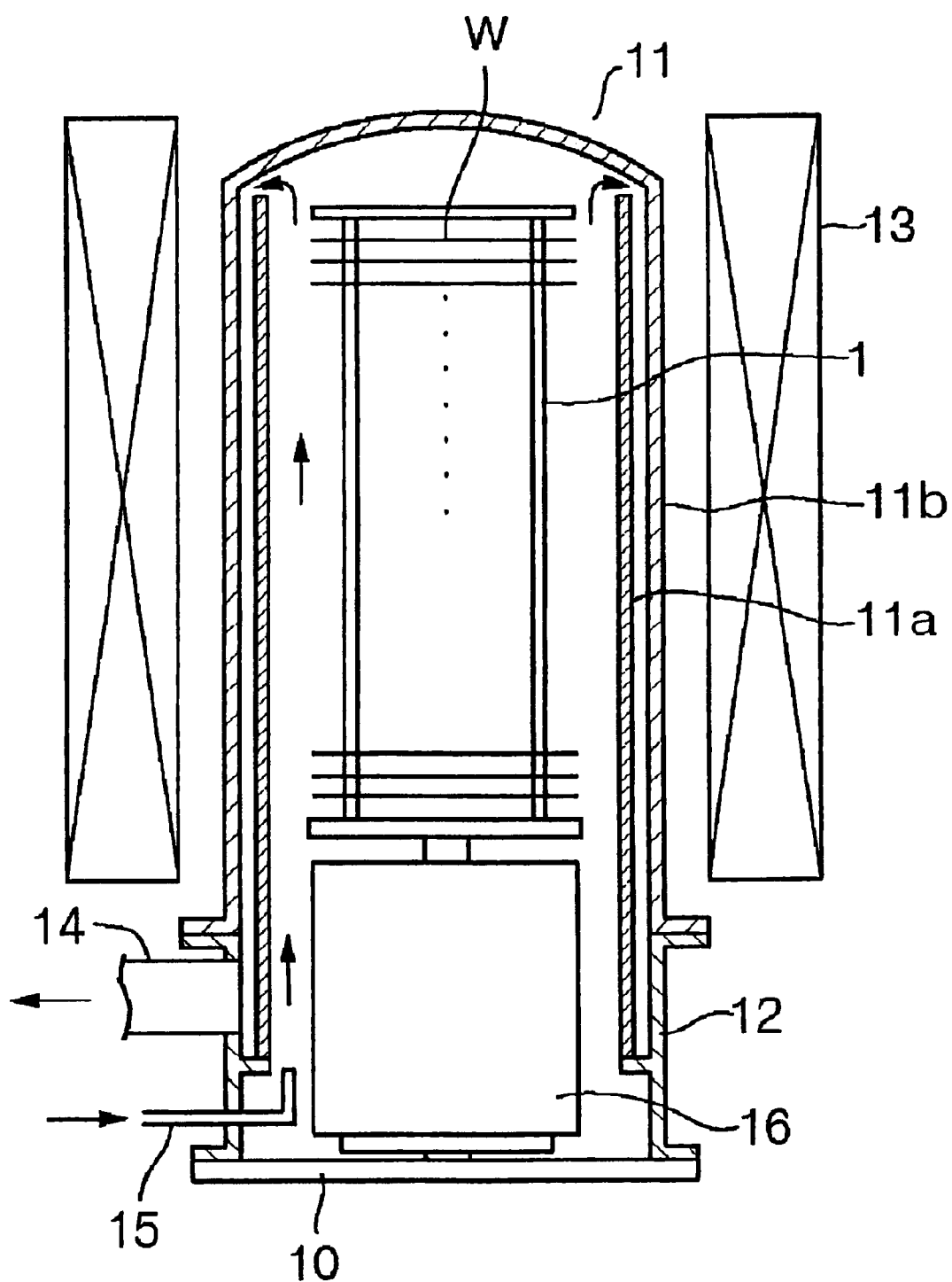
FIG. 12 is a longitudinal side view showing a conventional vertical heat treatment apparatus.

On the other hand, as a comparison example, films were formed on wafers W exactly in the same way except that an insulating unit composed of a conventional cylindrical body not having the heating unit shown in FIG. 12 was used, and the film thickness of each wafer W and the intra-surface uniformity were checked in the same way, and the bar graphs (oblique lines) and marks □ shown in FIG. 9 were obtained.

The results show that while when the insulating unit without a heating unit was used, there were variations in the mean film thickness at each position of top, center, and bottom, when the insulating unit with the heating unit of the present invention was used, the mean film thicknesses were almost equal to each other. The intra-surface uniformity of film thickness was more than 6% in the comparison example, while the intra-surface uniformity in the present invention was about 5% in the top position and less than 3% in the center and bottom positions, and it can be understood that the device of the present invention is effective. Assuming the maximum value, minimum value, and mean value of film thickness as Max, Min, and Ave respectively, the intra-surface uniformity is a value expressed by (Max−Min)/Ave×½×200.

Embodiment 2

A 200-mm wafer was subjected to the oxidation process using the vertical heat treatment apparatus shown in FIG. 6 and the silicon film on the surface of the wafer W was oxidized. The temperature in the treating atmosphere at the time of loading the wafer boat was set to 300° C., and the temperature was raised up to 850° C., and the wafer was treated for a predetermined time aiming at forming an oxide film with a thickness of 2 nm. Further, as a comparison example, the same process was performed using an insulating unit having 20 laminated quartz fins without heating unit. In each case, how wide a treating atmosphere having high temperature uniformity can be ensured was checked.

In the comparison example, side wafers (dummy wafers not being processed) are loaded on up to the 23rd staged from the lowest stage of the wafer boat and the film thickness uniformity of the wafer on the 24th stage from the bottom was 3.09%. In the case of the present invention, side wafers are loaded on up to the 5th stage from the lowest stage of the wafer boat and the film thickness uniformity of the wafer was 2.88%. Therefore, according to the present invention, the number of side wafers (dummy wafers) per each batch process can be reduced. That is to say, as compared with the comparison example, the intra-surface uniformity of film thickness according to the present invention can be on a level with that of the comparison example, and the treatable area (area where product wafers can be loaded) can be spread. The particle contamination on the wafer W was also checked and it was found that the particle contamination of the present invention was the same as that of the comparison example and particle contamination was not affected by installation of the heating unit.

The time period from the time of loading end of the wafer boat to the time of process start was measured while stabilizing the temperature in the reaction vessel. It was found that the time period of the present invention can be shortened by about 8 minutes compared with that of the comparison example, and therefore the temperature stabilization time is shortened.

Embodiment 3

Figure 10:
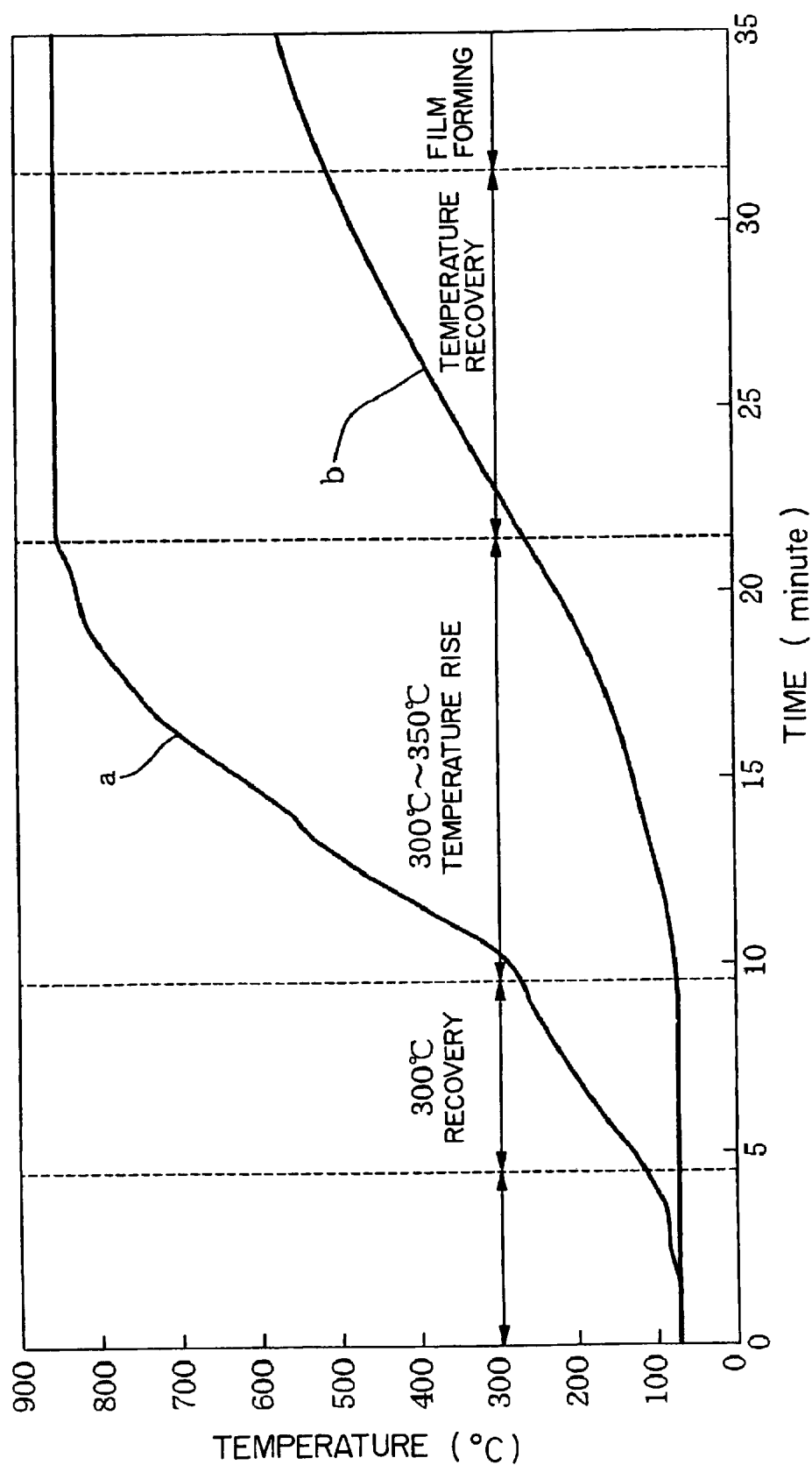
FIG. 10 is a characteristic diagram showing results of the temperature rising speed measured for an insulating unit used in the present invention and a conventional insulating unit.

With respect to the temperature in the vicinity of the surface of the heating unit of the present invention and the temperature in the vicinity of the top of the insulating unit of the comparison example, the temperature rise condition was checked by using the same apparatus as in Example 2, and the results shown in FIG. 10 were obtained. Letters "a" and "b" indicate curves corresponding to the insulating unit of the present invention and the insulating unit of the comparison example respectively. According to the present invention, the temperature rise of the insulating unit is fast and in the time area (recovery area) of stabilization at the target treating temperature, the temperature of the insulating unit was stable, while in the comparison example, the temperature rise of the insulating unit is slow, and even in the recovery area, the temperature rises continuously. Therefore, as a result, according to the present invention, it was found that the temperature stabilization time is shortened.

Embodiment 4

The situation of lowering temperature of the insulating unit from the point of time of unloading start in Embodiment 1 was shown in FIG. 11. Letters "a" and "b" indicate curves corresponding to the insulating unit relating to the present invention and the insulating unit of the comparison example respectively. The results show that the heat capacity of the insulating unit of the present invention may be small because it has the heating unit, so that the temperature can be lowered immediately. Therefore, when the wafer boat was transferred into the loading area of the wafer boat, the thermal damage to the robot and sensor can be reduced.

As mentioned above, according to the present invention, the time period required for temperature stabilization can be shortened, so that the throughput can be improved.

What is claimed is:

1. A heat treatment apparatus comprising:
   a reaction vessel with a lower open end,
   a holding tool contained in said reaction vessel for holding a plurality of objects to be processed,
   a cover for closing the lower open end of said reaction vessel,
   an insulating unit provided between said cover and said holding tool, said insulating unit having a heating unit and being fixed to said cover, said heating unit including ceramics and a heating resistor in the ceramics including few metallic impurities, and
   a revolving shaft means including a first revolving shaft passing through a through hole of said insulating unit, and a second revolving shaft connected to said first revolving shaft through a transmission unit and connected to said drive unit.

2. The heat treatment apparatus according to claim 1, wherein
   said heating unit is arranged at least on either of a top and a side of said insulating unit.

3. The heat treatment apparatus according to claim 1, wherein
   said insulating unit comprises insulating fins positioned on a side of said heating unit and heat insulators positioned under said insulating fins.

4. The heat treatment apparatus according to claim 1, wherein
   said insulating unit comprises a plurality of insulating fins arranged in a horizontal direction.

5. The heat treatment apparatus according to claim 1, wherein said second revolving shaft passes through said cover, and wherein a periphery of said second revolving shaft passing through said cover is surrounded by a labyrinth having a cover projection extending from said cover and a transmission projection extending from said transmission unit.

6. The heat treatment apparatus according to claim 1, wherein
   a plurality of supports are arranged on an outer periphery of said insulating unit,
   at least one support is a tubular one passing through said cover, and
   an electric feeding line for said heating unit is arranged in said tubular support.

7. The heat treatment apparatus according to claim 1, wherein
   said heating resistor is made of a carbon material having high purity.

8. The heat treatment apparatus according to claim 1, wherein
   said ceramics are quartz.

9. A heat treatment method comprising the steps of:
   holding objects to be processed in a multistage manner by a holding tool,
   transferring said holding tool holding the objects to be processed into a reaction vessel having a lower open end from underneath,
   heating an inside of said reaction vessel by a heater installed outside said reaction vessel, and
   feeding film forming gas to said reaction vessel to perform a film forming process to objects to be processed,
   wherein at said step of feeding film forming gas, a temperature on an under side of said holding tool is higher than that in an atmosphere where said objects to be processed are placed.

10. The heat treatment method according to claim 9, wherein
    at said step of feeding film forming gas, said film forming gas is fed from an under side of said holding tool to an above side of said holding tool and
    a temperature in a passing area of said film forming gas on said under side of said holding tool is higher than that in said atmosphere where said objects to be processed are placed.

11. The heat treatment method according to claim 9, wherein
    at said step of feeding film forming gas, said film forming gas is fed from an above side of said holding tool to said under side of said holding tool.

12. The heat treatment method according to claim 9, wherein
    said under side of said holding tool is heated by an insulating unit having a heating unit installed under said holding tool and
    a temperature on said under side of said holding tool is higher than that in said atmosphere where said objects to be processed are placed.

13. A heat treatment apparatus for heating objects to be processed, said apparatus comprising:
    a heating oven being controllable to attain a first temperature and having a lower open end;
    a cover for closing the lower open end of the heating oven;
    a holding tool located above the cover for holding the objects to be processed; and
    a heating unit provided between the cover and the holding tool, wherein the heating unit is controllable to attain a second temperature greater than the first temperature.

14. The heat treatment apparatus of claim 13, wherein the second temperature is greater than 800° C.

15. The heat treatment apparatus of claim 13, wherein the second temperature is 840° C.

16. The heat treatment apparatus of claim 13, wherein the first temperature is 800° C. and the second temperature is 840° C.

* * * * *